(12) United States Patent
Thees et al.

(10) Patent No.: US 9,793,294 B1
(45) Date of Patent: Oct. 17, 2017

(54) JUNCTION FORMATION WITH REDUCED $C_{eff}$ FOR 22NM FDSOI DEVICES

(71) Applicant: GLOBALFOUNDRIES Inc., Grand Cayman (KY)

(72) Inventors: Hans-Juergen Thees, Dresden (DE); Peter Baars, Dredsen (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/455,588

(22) Filed: Mar. 10, 2017

Related U.S. Application Data

(62) Division of application No. 15/185,267, filed on Jun. 17, 2016, now Pat. No. 9,634,088.

(51) Int. Cl.

| | |
|---|---|
| *H01L 29/06* | (2006.01) |
| *H01L 27/12* | (2006.01) |
| *H01L 29/417* | (2006.01) |
| *H01L 27/092* | (2006.01) |
| *H01L 29/16* | (2006.01) |

(52) U.S. Cl.
CPC ...... *H01L 27/1203* (2013.01); *H01L 27/0922* (2013.01); *H01L 29/16* (2013.01); *H01L 29/41783* (2013.01)

(58) Field of Classification Search
None
See application file for complete search history.

(56) References Cited

U.S. PATENT DOCUMENTS 9,634,088 B1 * 4/2017 Thees ................. H01L 29/0642
2009/0280579 A1 11/2009 Pal et al.

* cited by examiner

*Primary Examiner* — Jack Chen
(74) *Attorney, Agent, or Firm* — Amerson Law Firm, PLLC

(57) ABSTRACT

A semiconductor device includes an SOI substrate and a transistor device positioned in and above the SOI substrate. The SOI substrate includes a semiconductor bulk substrate, a buried insulation layer above the semiconductor bulk substrate, and a semiconductor layer above the buried insulation layer. The transistor device includes a gate structure having a gate electrode and a first cap layer covering upper and sidewall surfaces of the gate electrode. An oxide liner covers sidewalls of the gate structure and a second cap layer covers the oxide liner. A recess is located adjacent to the gate structure and is at least partially defined by an upper surface of the semiconductor layer, a bottom surface of the second cap layer and at least part of the oxide liner. Raised source/drain regions are positioned above the semiconductor layer and portions of the raised source/drain regions are positioned in the recess.

19 Claims, 14 Drawing Sheets

JUNCTION FORMATION WITH REDUCED $C_{eff}$ FOR 22NM FDSOI DEVICES

BACKGROUND

1. Field of the Disclosure

Generally, the present disclosure relates to the fabrication of integrated circuits and semiconductor devices, and in particular to forming silicon-on-insulator (SOI) semiconductor devices.

2. Description of the Related Art

The fabrication of advanced integrated circuits, such as CPUs, storage devices, application specific integrated circuits (ASICs) and the like, requires the formation of a large number of circuit elements on a given chip area according to a specified circuit layout. In a wide variety of electronic circuits, field effect transistors represent one important type of circuit element that substantially determines performance of the integrated circuits. Generally, a plurality of process technologies are currently practiced for forming field effect transistors (FETs), wherein, for many types of complex circuitry, metal-oxide-semiconductor (MOS) technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. Miniaturization and increase of circuit densities represent ongoing demands.

A field effect transistor, irrespective of whether it may be an N-channel transistor or a P-channel transistor, typically comprises so-called PN junctions that are formed by an interface of highly doped regions, referred to as drain and source regions, with a slightly doped or non-doped region, such as a channel region, disposed between the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on, among other things, the dopant concentration, the mobility of the charge carriers and, for a given extension of the channel region in the transistor width direction, the distance between the source and drain regions, which is also referred to as channel length. Hence, in combination with the capability of rapidly creating a conductive channel below the insulating layer upon application of the control voltage to the gate electrode, the conductivity of the channel region substantially affects the performance of MOS transistors. Thus, as the speed of creating the channel, which depends on the conductivity of the gate electrode, and the channel resistivity substantially determine the transistor characteristics, the scaling of the channel length is a dominant design criterion for accomplishing an increase in the operating speed of the integrated circuits. As the channel length is reduced, the thickness of the gate dielectric is also reduced. The scaling of the gate dielectric is limited by several factors, such as defects, power supply voltage, time-dependent dielectric breakdown and leakage currents.

When forming source/drain regions of semiconductor devices, in particular for silicon-on-insulator (SOI) substrates, control of various capacitances is very important. For instance, with regard to applications to ring oscillators, ring oscillator speed degrades with increasing gate/drain capacitance. This also includes contributing capacitances between the gate and the semiconductor material extending along the sidewalls of the gate structure. In order to minimize this capacitance, the distance from the semiconductor material extending along the sidewalls of a gate structure may be chosen to be large. This may be achieved by forming thicker spacers. However, while a large thickness of spacers would suppress the above-mentioned parasitic capacitance, it would contrast another requirement, said other requirement would be to have a close proximity of the raised source/drain region to a channel region so as to have a sufficient overlap capacitance between these two regions.

In view of the above, the present disclosure relates to semiconductor devices, in particular, transistor devices and techniques for forming transistor devices, allowing for fast ring oscillator speed high-frequency, while having sufficient overlap capacitance, which may be integrated in the process flow of fully depleted silicon-on-insulator (FDSOI) manufacturing.

SUMMARY OF THE DISCLOSURE

The following presents a simplified summary of the disclosure in order to provide a basic understanding of some aspects of the subject matter that is described in further detail below. This summary is not an exhaustive overview of the disclosure, nor is it intended to identify key or critical elements of the subject matter disclosed here. Its sole purpose is to present some concepts in a simplified form as a prelude to the more detailed description that is discussed later.

Generally the subject matter disclosed herein relates to semiconductor devices and methods for manufacturing semiconductor devices wherein enhanced transistor performance may be obtained for N-channel transistors and P-channel transistors on the basis of fully depleted silicon-on-insulator (FDSOI) techniques.

In one exemplary embodiment, a semiconductor device is disclosed that includes a semiconductor-on-insulator (SOI) substrate and a transistor device positioned in and above the SOI substrate. The SOI substrate includes a semiconductor bulk substrate, a buried insulation layer positioned above the semiconductor bulk substrate, and a semiconductor layer positioned above the buried insulation layer. The transistor device includes, among other things, a gate structure positioned above the semiconductor layer, wherein the gate structure includes a gate electrode and a first cap layer covering upper and sidewall surfaces of the gate electrode. Additionally, an oxide liner is positioned adjacent to and covers sidewalls of the gate structure, and a second cap layer is positioned adjacent to and covers the oxide liner. The exemplary semiconductor device further includes a recess that is located adjacent to the gate structure, the recess being at least partially defined by an upper surface of the semiconductor layer, a bottom surface of the second cap layer, and at least part of the oxide liner. The semiconductor device also includes raised source/drain regions that are positioned above the upper surface of the semiconductor layer, wherein portions of the raised source/drain regions are positioned in the recess.

Another illustrative semiconductor device disclosed herein includes, among other things, a semiconductor-on-insulator (SOI) substrate and a transistor device positioned in and above the SOI substrate. The SOI substrate includes a semiconductor bulk substrate, a buried insulation layer positioned above the semiconductor bulk substrate, and a semiconductor layer positioned above the buried insulation layer. The transistor device includes a gate electrode positioned above the semiconductor layer, a cap layer positioned above the gate electrode, and a sidewall spacer structure positioned adjacent to sidewalls of the gate electrode and sidewalls of the cap layer. The sidewall spacer structure includes a first spacer, an oxide liner positioned adjacent to and covering the first spacer, and a second spacer positioned adjacent to and covering the oxide liner. The disclosed semiconductor device also includes a recess that is located adjacent to the gate structure, wherein the recess extends above and substantially parallel to an upper surface of the semiconductor layer and extends below a bottom surface of the second spacer and below at least a portion of the oxide liner. Furthermore, raised source/drain regions are positioned above the upper surface of the semiconductor layer, wherein portions of the raised source/drain regions are positioned in the recess.

In yet a further exemplary embodiment of the present disclosure, a semiconductor device is disclosed that includes a first transistor device that is positioned in and above a first active region of an SOI substrate. The first transistor device includes, among other things, a first gate electrode positioned above an upper surface of a first semiconductor layer positioned in the first active region, a first cap layer that is positioned above the first gate electrode, and a first sidewall spacer structure that is positioned adjacent to sidewalls of the first gate electrode and sidewalls of the first cap layer. The transistor further includes a first recess that is located adjacent to the first gate structure, wherein the first recess extends above and substantially parallel to the upper surface of the first semiconductor layer and below a bottom surface of at least a portion of the first sidewall spacer structure. Furthermore, first raised source/drain regions are positioned above the upper surface of the first semiconductor layer, wherein portions of the first raised source/drain regions are positioned in the first recess.

BRIEF DESCRIPTION OF THE DRAWINGS

The disclosure may be understood by reference to the following description taken in conjunction with the accompanying drawings, in which like reference numerals identify like elements, and in which.

Figure 1:
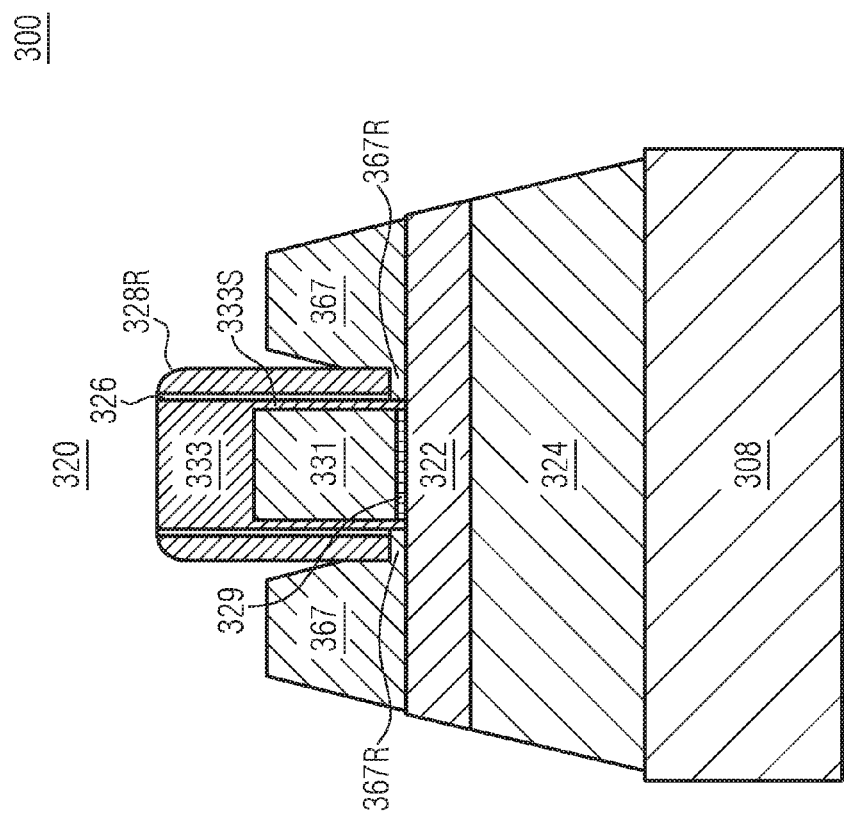
FIG. 1 illustrates a semiconductor device according to the present disclosure.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the claimed invention to the particular forms disclosed, but on the contrary, the intention is to cover all modifications, equivalents, and alternatives falling within the spirit and scope of the claimed invention.

DETAILED DESCRIPTION

Various illustrative embodiments of the present subject matter are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The following embodiments are described in sufficient detail to enable those skilled in the art to make use of the disclosure. It is to be understood that other embodiments would be evident, based on the present disclosure, and that system, structure, process or mechanical changes may be made without departing from the scope of the present disclosure. In the following description, numeral-specific details are given to provide a thorough understanding of the disclosure. However, it would be apparent that the embodiments of the disclosure may be practiced without the specific details. In order to avoid obscuring the present disclosure, some well-known circuits, system configurations, structure configurations and process steps are not disclosed in detail.

The present subject matter will now be described with reference to the attached figures. Various systems, structures and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

As used herein, spatial references "top," "bottom," "upper," "lower," "vertical," "horizontal" and the like may be used for convenience when referring to structures of FET devices. These references are intended to be used in a manner consistent with the drawings only for teaching purposes, and are not intended as absolute references for FET structures. For example, FETs may be oriented spatially in any manner different from the orientations shown in the drawings. "Vertical" is used to refer to a direction normal to the semiconductor layer surface, and "horizontal" is used to refer to a direction parallel to the semiconductor layer surface when referring to the drawings. "Upper" is used to refer to a vertical direction away from the semiconductor layer. An element positioned "above" ("below") another one is located farther away from (closer to) the semiconductor layer surface as compared to the other one.

As will be readily apparent to those skilled in the art upon a complete reading of the present application, the present method is applicable to a variety of technologies, for example, NMOS, PMOS, CMOS, etc., and is readily applicable to a variety of devices, including, but not limited to, logic devices, memory devices, SRAM devices etc., in principle. The techniques and technologies described herein may be utilized to fabricate MOS integrated circuit devices, including NMOS integrated circuit devices, PMOS integrated circuit devices and CMOS integrated circuit devices. In particular, the process steps described herein are utilized in conjunction with any semiconductor device fabrication process that forms gate structures for integrated circuits, including both planar and non-planar integrated circuits. Although the term "MOS" properly refers to a device having a metal gate electrode and an oxide gate insulator, that term is used throughout to refer to any semiconductor device that includes a conductive gate electrode (whether metal or other conductive material) that is positioned over a gate insulator (whether oxide or other insulator) which, in turn, is positioned over a semiconductor bulk substrate.

FIG. 1 illustrates an example of a semiconductor device 300 according to one illustrative embodiment of the present disclosure. Depending on the desired device type, the semiconductor device 300 may have an N-channel field effect transistor active region or a P-channel field effect transistor active region, with a gate structure 320 formed above the active region. The semiconductor device 300 may be formed in and above a silicon-on-insulator (SOI) substrate, which in certain exemplary embodiments may include a semiconductor bulk substrate 308, a buried oxide (BOX) layer 324 formed on and above the semiconductor bulk substrate 308, and a semiconductor layer 322—sometimes referred to as the "active" semiconductor layer—formed on and above the BOX layer 324. The material of the active semiconductor layer 322 may include a significant amount of silicon due to the fact that semiconductor devices of high integration density may be formed in volume production on the basis of silicon, due to the enhanced availability and the well-established process techniques developed over the last decades. However, any other appropriate semiconductor materials may be used, for instance, a silicon-based material containing other iso-electronic components, such as germanium, carbon, silicon/germanium, silicon/carbon, other II-VI or III-V semiconductor compounds and the like. In particular, in case the semiconductor device 300 being a transistor device is an N-channel FET, the semiconductor layer 322 may be a crystalline silicon layer, whereas if the transistor device is a P-channel FET, the semiconductor layer 322 may comprise silicon-germanium (SiGe) material.

As illustrated in FIG. 1, the gate structure 320 is formed above the semiconductor layer 322, and may include a gate electrode 331 and a first cap layer 333. In some embodiments, the first cap layer 333 is formed above and covers an upper surface of the gate electrode 331, and may also include a portion 333S that is formed adjacent to and covers the sidewalls of the gate electrode 331. In certain embodiments, the gate structure 320 may include a gate metal layer 329 that is formed above the semiconductor layer 322. Additionally, the gate structure 320 may also include a gate dielectric (not shown)—for example Hf-Oxide or Hf-Silica—and/or a work function-adjusting material layer (not shown) positioned between the gate metal layer 329 and the semiconductor layer 322. As noted, the gate structure 320 further includes a cap layer 333, and in some embodiments the material of the cap layer 333 may include, for example, silicon nitride. As indicated in FIG. 1, the cap layer 333 may at least partially encapsulate the gate electrode 331, i.e., be formed above and adjacent to (around) the gate electrode 331, and may be used to protect the gate electrode 331 during device fabrication. See, FIGS. 7-8 and FIGS. 13-14, described further below. After fabrication, at least part of the cap layer 333 may be removed at later process stages in order to be able to form silicided regions in and/or on the gate electrode 331.

The gate structure 320 further comprises an oxide liner 326 covering the sidewalls of the gate structure 320. As shown in FIG. 1, the oxide liner 326 may extend in a direction that is substantially perpendicular to the semiconductor layer 322. In some illustrative embodiments, the material oxide liner 326 may include, for example, undoped silicon oxide (UDOX) or any other suitable deposited oxide, e.g., Low Pressure Tetra Ethyl Ortho Silicate (LP-TEOS) or Sub-Atmospheric Tetra Ethyl Ortho Silicate (SA-TEOS).

As is shown in the exemplary configuration depicted in FIG. 1, the oxide liner 326 substantially separates the first cap layer 333 from a second cap 328R that may serve as a nitride sidewall spacer on the oxide liner 326. It should be understood that, in some embodiments, the first cap layer 333 may be deposited before gate etching occurs, and in such embodiments, after gate etching has been performed the cap layer 333 is substantially only present on top of the gate. In order to form a thin nitride spacer 328R directly on the sidewalls of the gate structure 320, as is shown in FIG. 1, a suitable deposition process may be performed so as to deposit a nitride layer as required, followed by a subsequent etching process so as to form the nitride spacer (second cap layer) 328R. These steps are not shown here but are just similar steps to those illustrated in FIGS. 2-14.

As may be understood after a complete reading of the present disclosure, the thickness of the nitride spacer 328R depicted in FIG. 1 may be independently chosen. Moreover, for the first cap layer 333, a thickness of the first cap layer 333 in a lateral direction with respect to the gate structure 320—which may also be termed as a direction that is substantially parallel to the semiconductor layer 322—may also be chosen independently. Moreover, a thickness of the oxide liner 326 in a direction that is substantially parallel to the semiconductor layer 322 may be selected independently of the thickness of either the cap layer 333 or the nitride spacer 328R. Also, the thickness of the nitride spacer 328R in the direction substantially parallel to the semiconductor layer 322 may be selected independently of the other thicknesses, i.e., the thickness of the cap layer 333 in either direction discussed above, and/or the thickness of the oxide liner 326. Thus, the overlap of the channel region and a source/drain region 367 (see below) may be optimized independently of any optimization of gate/drain or fringe capacitances.

With continuing reference to FIG. 1, the illustrative semiconductor device 300 may further include epitaxially raised source/drain (RSD) regions 367 that are located in proximity of or adjacent to the gate structure 320. The raised source/drain regions 367 are provided on and above the semiconductor layer 322. In particular, the raised source/drain regions do not substantially extend into the semiconductor layer 322. As shown in FIG. 1, the gate structure 320 of the semiconductor device 300 exhibits a recess 367R that is positioned between the bottom surface of the second cap layer (or spacer) 328R and the upper surface of the semiconductor layer 322. Furthermore, the recess may extend at least partially beneath the oxide liner 326. The recess 367R is also filled by the material of the raised source/drain regions 367. Thus, a small portion of the raised sourced drain regions 367, e.g., in the region 367R, is moved closer to the gate structure 320, thereby effectively providing a source/drain region 367 on either side of the gate structure 320. The source/drain regions 367 are epitaxially raised, i.e., they extend in a direction that is substantially perpendicular to the semiconductor layer 322, and portions of the raised source/drain regions 367 also extend into and fill the recesses 367R on either side of the gate structure 320, i.e., above the upper surface of the semiconductor layer 322 at the substrate level.

Accordingly, FIG. 1 illustrates an exemplary semiconductor device 300 having an N-channel field effect transistor or a P-channel field effect transistor active region. The semiconductor device 300 as illustrated in FIG. 1 may be formed in and above a silicon-on-insulator (SOI) substrate, and the silicon-on-insulator (SOI) substrate may include a semiconductor bulk substrate 308, a buried oxide layer 324 formed on and above the semiconductor bulk substrate 308, and an active semiconductor layer 322 formed on and above the buried oxide layer 324. The semiconductor device 300 further has a gate electrode 331 having a first cap layer 333 on the gate electrode 331. Furthermore, as depicted in FIG. 1, the exemplary semiconductor device 300 has a sidewall spacer structure 333S/326/328R that is positioned adjacent to the gate electrode 331 and includes a first spacer 333S (i.e., a sidewall portion of the first cap layer 333), an oxide liner 326 positioned adjacent to the first spacer 333S, and a second spacer 328R positioned adjacent to the oxide liner 326. The semiconductor device 300 further includes a recess 367R that extends over/above the upper surface of the active semiconductor layer 322 and beneath/below the bottom surfaces of the second spacer 328R and at least a part of the oxide liner 326. In other words, the recess 367R extends between the semiconductor layer 322 and at least a portion of the sidewall spacer structure 333S/326/328R in a direction that is substantially parallel to the upper surface of the semiconductor layer 322, and thus substantially perpendicular to the sidewall spacer structure 333S/326/328R. The semiconductor device 300 further includes raised source/drain regions 367 that are provided above the upper surface of the semiconductor layer 322, wherein portions of the raised source/drain regions 367 extend into in the recesses 367R. Thus, the recesses 367R are substantially filled by the material of the source/drain regions 367. Furthermore, neither the recesses 367R nor the raised source/drain regions 367 are provided in or extend into the semiconductor layer 322.

As further processing of fully depleted silicon-on-insulator (FDSOI) structures relies on out-diffusion of raised source/drain structures, providing the raised source/drain regions as shown in FIG. 1 may enhance out-diffusion close to the gate structure, i.e., close to the gate. Furthermore, the capacitances may be separately controlled and optimized so as to provide a higher ring oscillator speed.

FIGS. 2-14 illustrate, in accordance with one illustrative embodiment of the present disclosure, steps of a process flow for forming semiconductor devices similar to the semiconductor device of FIG. 1. As FIG. 1 illustrates a semiconductor device, the following process flow illustrates one illustrative embodiment of a method of forming a semiconductor device. For practical reasons, a process flow may include forming more than one semiconductor device at a time. In particular, FIGS. 2-14 illustrate forming at least one semiconductor device including a transistor device being an N-channel field effect transistor, together with forming another at least one semiconductor device including a transistor device being a P-channel field effect transistor. Here, a region of forming the N-channel field effect transistor and a region of forming the P-channel field effect transistor may be separated by insulating regions, such as shallow trench isolation regions.

Figure 2:
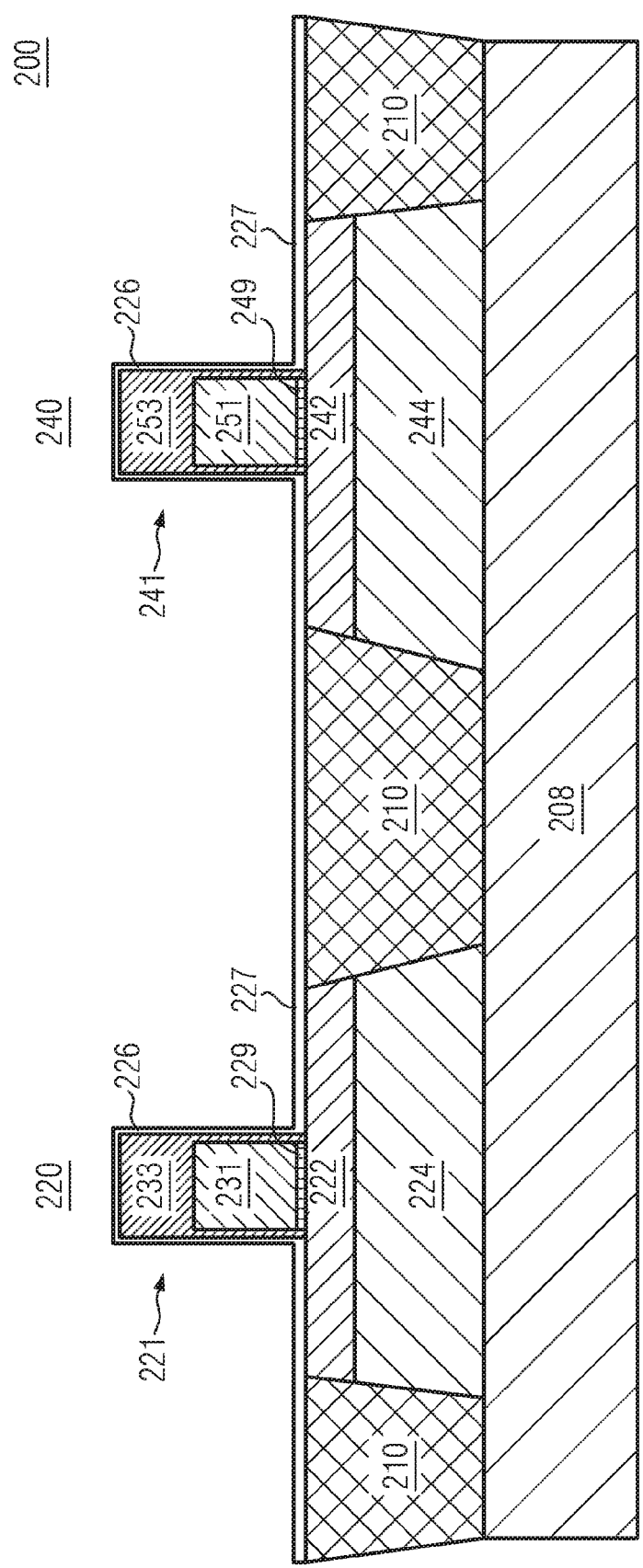
FIGS. 2-14 illustrate, in accordance with the present disclosure, steps of a process flow for forming semiconductor devices similar to the semiconductor device of FIG. 1.

FIG. 2 illustrates a semiconductor device 200 having an N-channel field effect transistor active region 220 and a P-channel field effect transistor active region 240. Similar to FIG. 1, the semiconductor device 200 comprises a semiconductor bulk substrate 208. A buried oxide layer 224 is formed on the semiconductor bulk substrate 208 in the N-channel active region 220. Further, a buried oxide layer 244 is formed on the semiconductor bulk substrate 208 in the P-channel active region 240. The buried oxide layers 224 and 244 may comprise similar materials. Further, semiconductor layers 222 and 242 are formed on the respective buried oxide layers 224 and 244. Semiconductor layers 222 and 242 may comprise a significant amount of silicon due to the fact that semiconductor devices of high integration density may be formed in volume production on the basis of silicon due to the enhanced availability and the well-established process techniques developed over the last decades. However, any other appropriate semiconductor materials may be used, for instance, a silicon-based material containing other iso-electronic components, such as germanium, carbon, silicon/germanium, silicon/carbon, other II-VI or III-V semiconductor compounds and the like. Semiconductor layers 222 and 242 may comprise different materials owing to the type of the transistor active region, e.g., 220 or 240. In particular, for the N-channel field effect transistor active region 220, the semiconductor layer 222 may be a crystalline silicon layer. For the P-channel field effect transistor active region 240, the semiconductor layer 242 may comprise silicon-germanium (SiGe) material.

FIG. 2 illustrates that shallow trench isolation regions 210 are formed on the bulk substrate 208 so as to separate the semiconductor layer 222 and buried oxide layer 224 from the semiconductor layer 242 and buried oxide layer 244. In other words, the active regions 220 and 240 are separated by the shallow trench isolation regions 210. The shallow trench isolation regions 210 may be etched into the wafer material.

FIG. 2 further illustrates that gate structures 221 and 241 are formed on the semiconductor layer 222 in the N-channel active region 220 and on the semiconductor layer 242 in the P-channel active region 240, respectively. Gate structures 221 and 241 include gate electrodes 231 and 251, respectively. Gate structures 221 and 241 further include cap layers 233 and 253, respectively. Cap layers 233 and 253 each may comprise silicon nitride. Cap layers 233 and 253 each may at least partially encapsulate the respective gate structures 221 and 241 on and above the corresponding semiconductor layers 222 and 242, respectively. Furthermore, the gate structures 221 and 241 may include gate metal layers 229 and 249, respectively, on the respective semiconductor layers 222 and 242. The gate electrodes 231 and 251 may further include a gate dielectric and a work function-adjusting material layer. The cap layers 233 and 253 may be provided by molecular layer deposition (not shown). An etching step may remove cap layer material from a surface of the semiconductor layers 222 and 242 (not shown) without consuming silicon-on-insulator material.

FIG. 2 further illustrates an oxide liner 226, 227 formed over the entire surface of the semiconductor device 200. The oxide liner 226, 227 may comprise undoped silicon oxide. A typical thickness of the oxide liner 227 may be on the order of 40-60 Å (4-6 nm) in the regions on the semiconductor layers 222 and 242 as well as the regions of the shallow trench isolators 210, respectively. However, the thickness of the oxide liner 226 on the gate structures 221 and 241, i.e., on the cap layers 233 and 253, may be different. In particular, while one forming step is applied, the growth rate of undoped silicon oxide of the oxide liner 226, 227 may be different on silicon or silicon-germanium material 222 and 242, on the one hand, and on the silicon nitride material of the cap layers 233 and 253 on the other hand. In particular, the thickness of the oxide liner 226 on the silicon nitride material of the cap layers 233 and 253 may be about a factor of two less, i.e., thinner, than the thickness of the oxide liner 227 on the other regions of the semiconductor device 200. Thereby, a thin layer of oxide liner 226 is provided over the gate structures 221 and 241, whereas elsewhere the layer of oxide liner 227 is about a factor of two thicker. Thus, effectively, the oxide liner includes two parts, one part of the oxide liner 226 over the cap layers 233 and 253 of the gate structures 221 and 241, respectively, and another part of the oxide liner 227 elsewhere, i.e., on the semiconductor layers 222 and 242, respectively. As the thickness of the oxide layer 226 only depends on the amount of material applied by the single forming step, the thickness of the oxide layer may be readily controlled.

Figure 3:
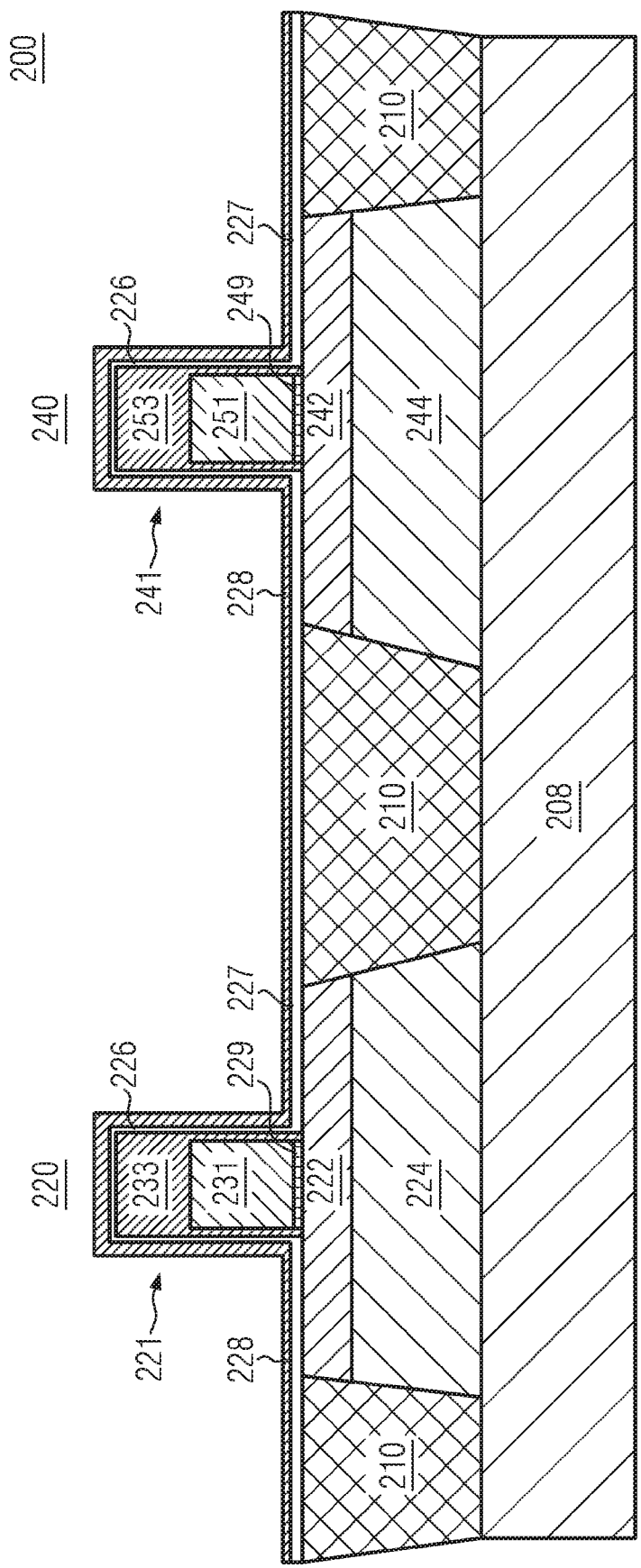

FIG. 3 illustrates a further forming step, and in particular a step of forming another layer of silicon nitride 228 on the oxide liner 226, 227. The layer of silicon nitride 228 serves as a second cap layer 228. The thickness of the second cap layer 228 may be chosen independently of any other of the thickness of layers of the semiconductor device 200. For the subsequent steps, it should be chosen whether to proceed first with the P-channel region 240 or with the N-channel region 220. In the following, the P-channel region 240 is chosen first. However it should be understood that the N-channel region 220 may be chosen first, as well.

Figure 4:
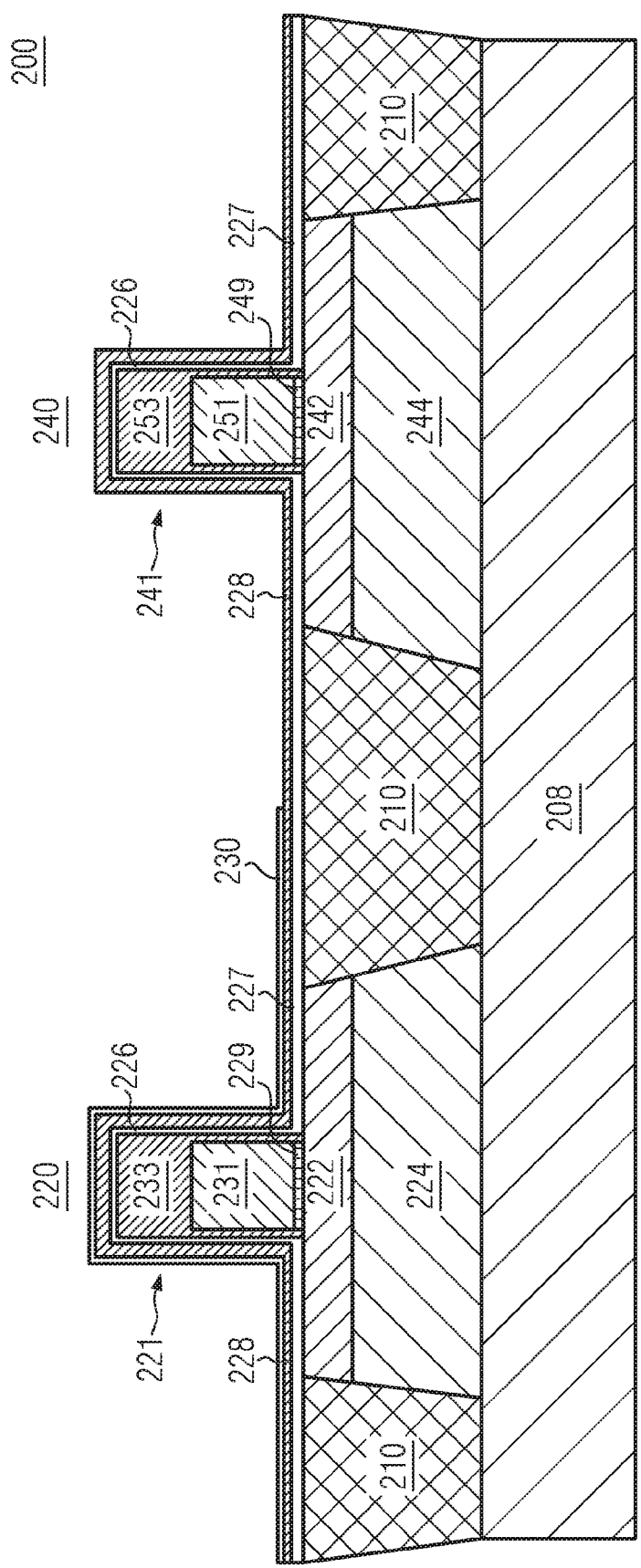

Having selected to proceed first with the P-channel region 240, FIG. 4 illustrates a masking step for the N-channel region 220. Thus, in accordance with well-understood masking procedures, a masking layer 230 is provided over the N-channel region 220 on the second cap layer 228. The masking layer 230 may thus provide etch protection in a subsequent step.

Figure 5:
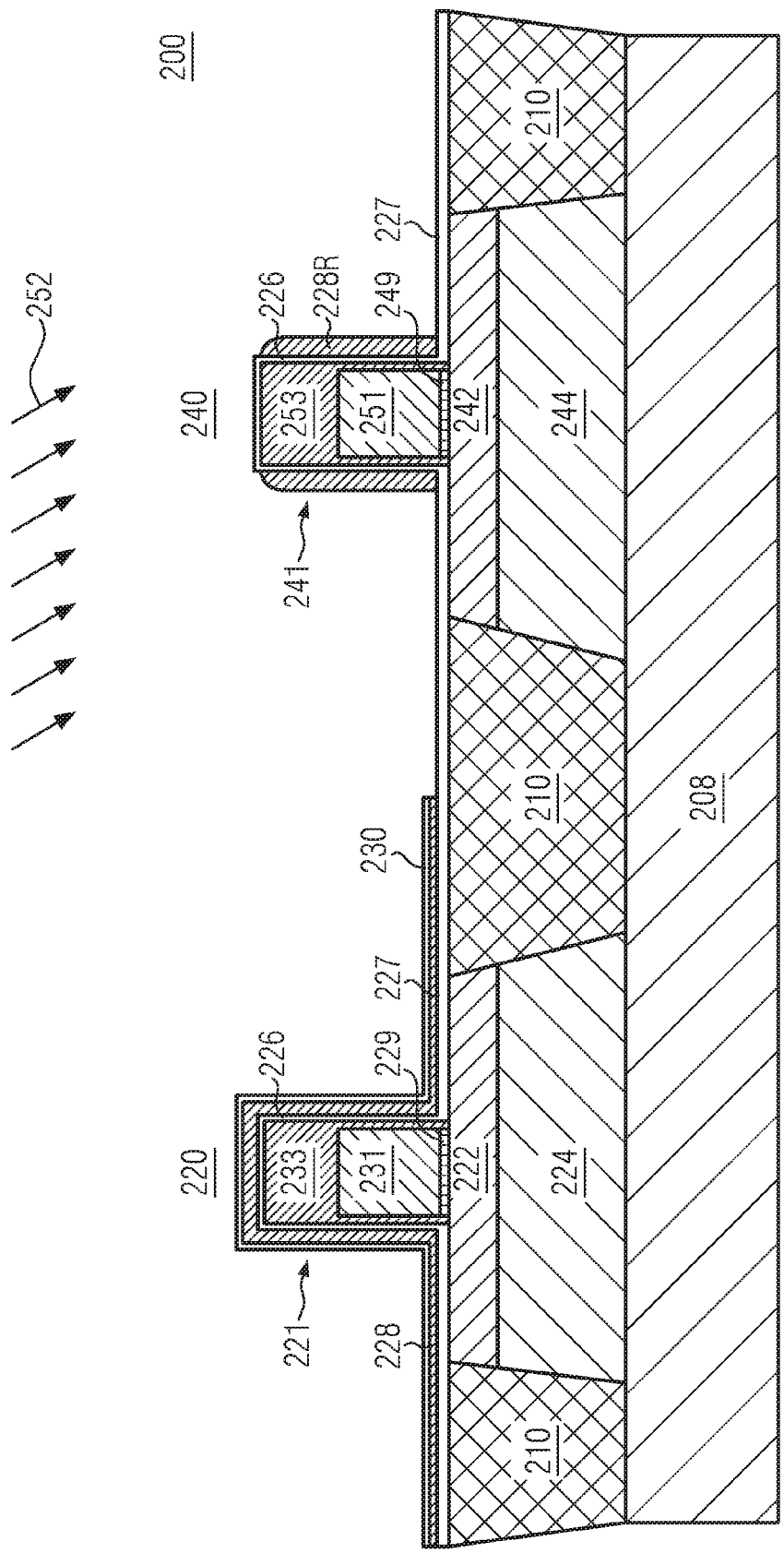

FIG. 5 illustrates an etching process 252 on the semiconductor device 200. The etching process 252 may utilize well-understood etching techniques for etching silicon nitride. The second cap layer 228 is removed from the oxide layer 226, 227 by the etching process 252. On the other hand, the N-channel region 220 is protected by the masking layer 230. The etching process 252 is stopped once the oxide layer 226 above the gate cap layer 253 is reached. Thus, at the top of the gate structure 241, i.e., on the gate cap layer 253, the oxide layer 226 is freed, again. Furthermore, on the sides of the gate structure 241 in a direction substantially perpendicular to the semiconductor layer 242, a remainder 228R of the second cap layer 228 is formed, serving as a nitride spacer. The thickness of this remainder, i.e., nitride spacer 228R, may be controlled by the etching process 252.

Figure 6:
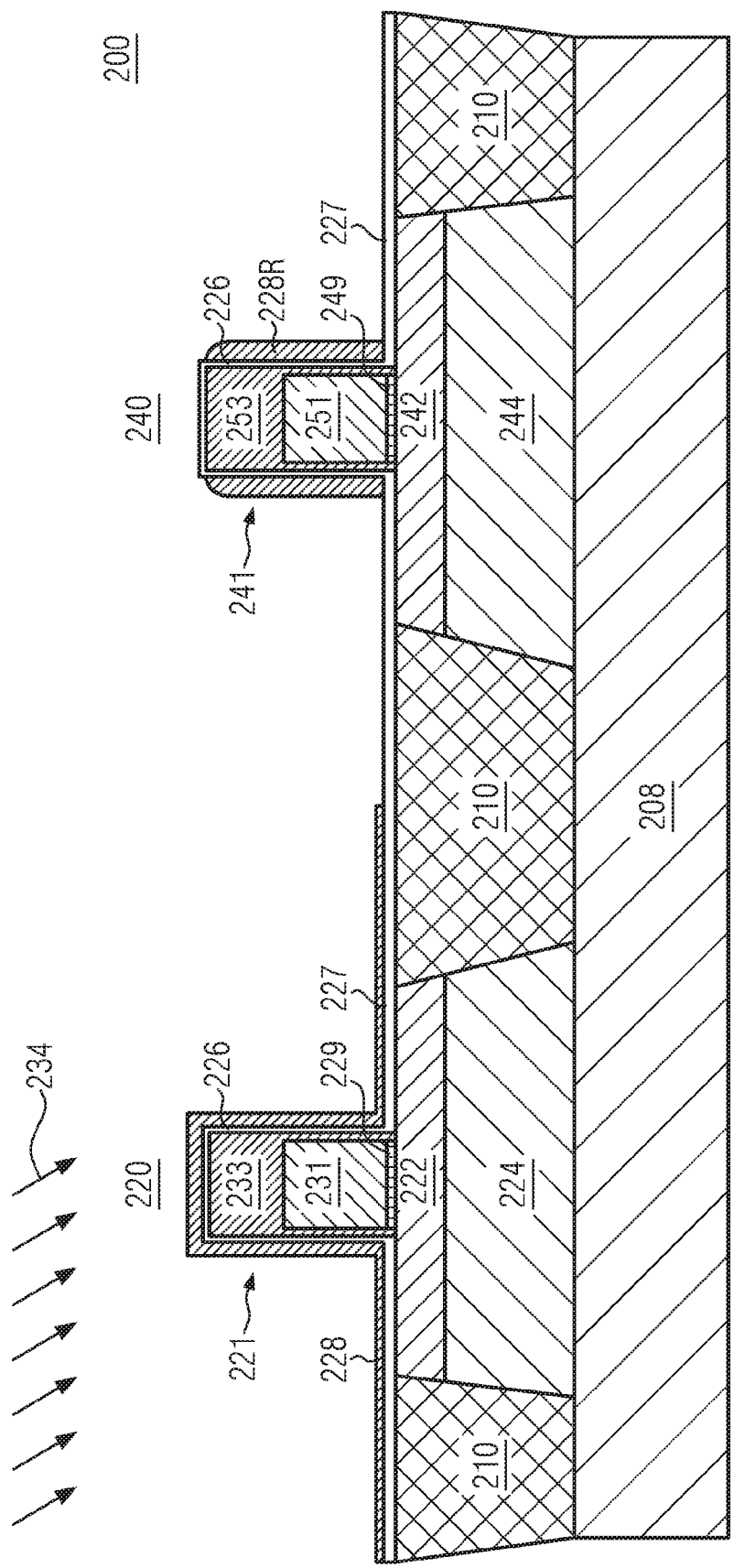

FIG. 6 illustrates a further processing step 234 so as to remove or strip the masking layer 230 on the N-channel region 220. The removal step may include well-understood techniques for mask removal. The mask removal step 234 as illustrated in FIG. 6 may serve as a preparatory step for a following etching step in the proximity of the gate structure 241 of the P-channel region 240.

Figure 7:
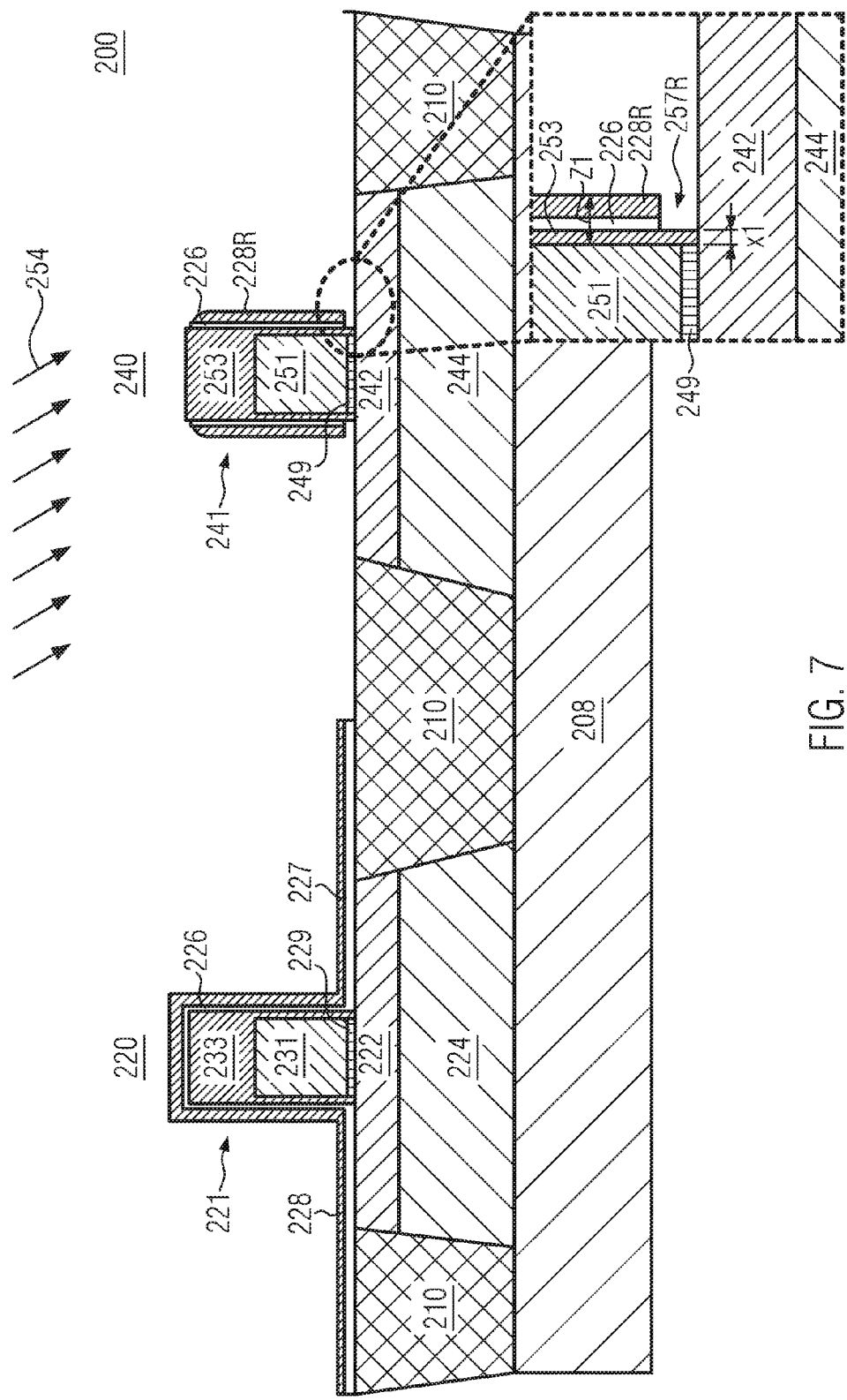

FIG. 7 illustrates a further processing step 254 so as to remove the part of the oxide liner 227 which was formed on the semiconductor layer 242 and on the shallow trench insulators 210. Processing step 254 may include an etching step using well-understood etching techniques. Thereby, the thicker part 227 of the oxide layer 226, 227 is removed from the semiconductor layer 242 in the P-channel region. Owing to the sequence of forming steps of FIGS. 2-6, the processing step 254 will also under-etch the remainder of the second cap layer 228R and the first part of the oxide liner 226 in a direction substantially parallel to the semiconductor layer 242 so as to form a recess 257R on and above the semiconductor layer 242. In other words, the second cap layer 228R will be under-etched in proximity to the gate structure 241. This is also indicated in the enlargement figure of FIG. 7. Further, the first part of the oxide liner 226 will also be at least partially removed by the processing step 254. As indicated in FIG. 7, the gate electrode 251 as well as gate metal layer 249 remain covered by the first cap layer 253. The thickness x1 of the first cap layer 253 in a direction substantially perpendicular to the gate electrode 251 and on the semiconductor layer 242 may be controlled by the intensity of the processing step. The longer the processing step 254 is applied, the thinner x1 gets. Moreover, the combined thickness Z1 of the first cap layer 253, the oxide layer 226 and the second cap layer 228R in a direction substantially perpendicular to the gate electrode 251 and on the semiconductor layer 242 is independent from the processing step 254; it is the sum of the deposition thicknesses. It should be noted that each of x1 and Z1 may be controlled independently and that it is also possible to only partially remove the oxide layer 226, so that the recess 257R is smaller than the sum of 226 and 228R layer thicknesses. Typical ranges for x1 are 4-8 nm, whereas Z1 may range between 8-20 nm, depending on the needed device performance requirements.

Figure 8:
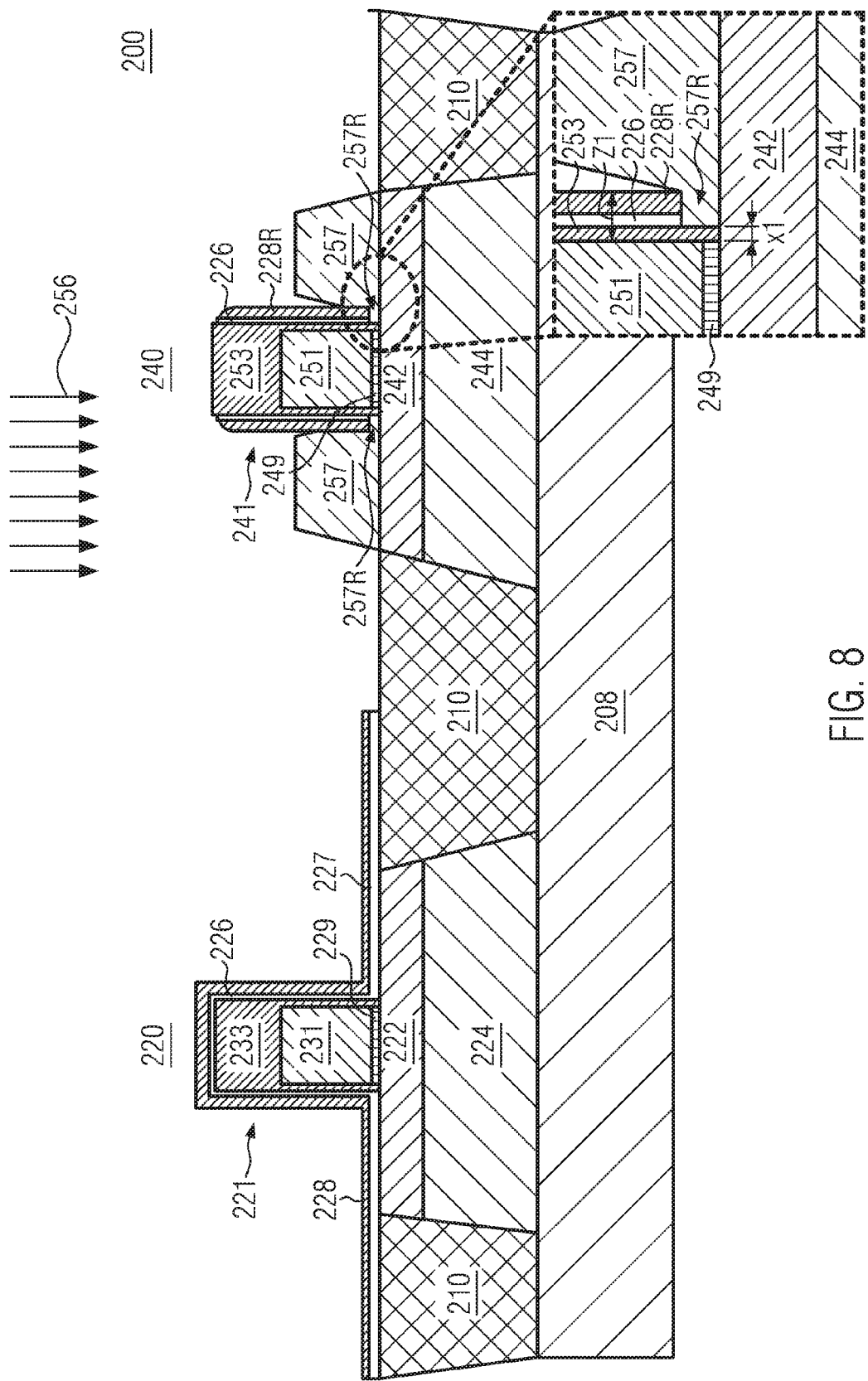

FIG. 8 illustrates a further processing step 256 for epitaxially growing raised source/drain regions 257 on the semiconductor layer 242 in the P-channel region 240. The raised source/drain regions 257 will raise in a direction substantially perpendicular to the semiconductor layer 242. The raised source/drain regions 257 will fill the recesses 257R on either side, i.e., in the proximity of the gate structure 241. Thereby, a small portion of the total raised source/drain regions 257 will be formed closer to the gate electrode 251. A larger part of the raised source/drain regions 257 will be formed further away from the gate electrode 251. Since all the thicknesses of the cap layers 253 and 228R, respectively, as well as the oxide layer 226, may be selected independently, the overall capacitances may be optimized.

Figure 9:
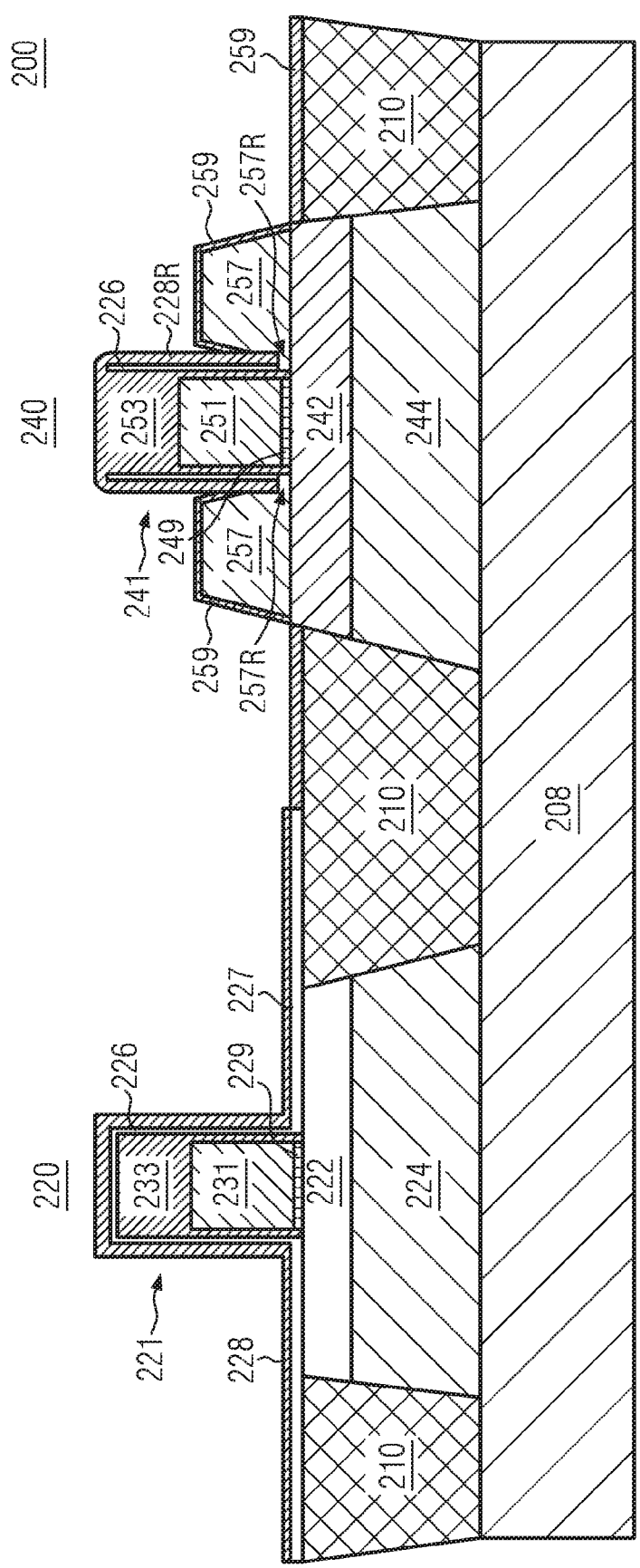

FIG. 9 shows a further processing step by covering semiconductor device 200 at least on the P-channel region 240 with a silicon nitride layer 259. Starting from FIG. 9, this includes preparatory steps for processing the N-channel region similarly as the P-channel region as illustrated with regard to FIGS. 3-8.

Figure 10:
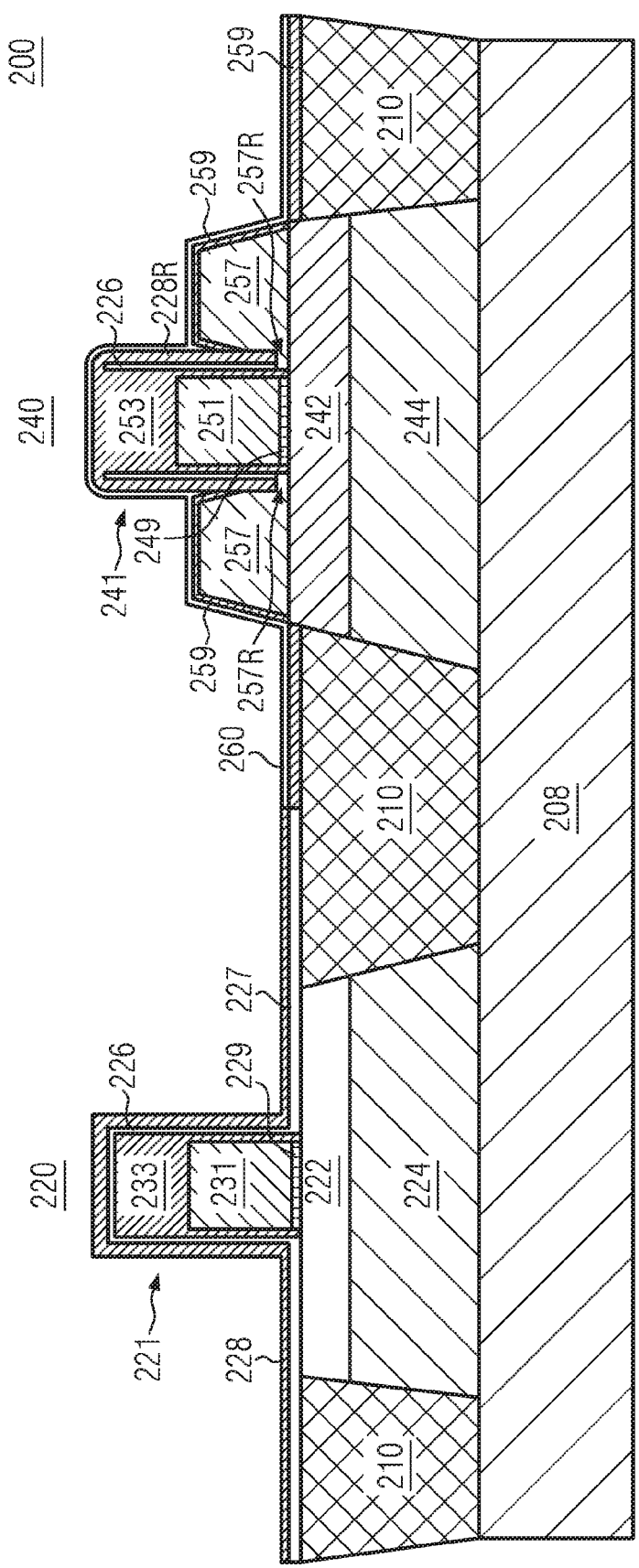

FIG. 10 illustrates a further processing step for providing a masking layer 260 over the P-channel region 240 so as to protect the P-channel region during further processing steps.

Figure 11:
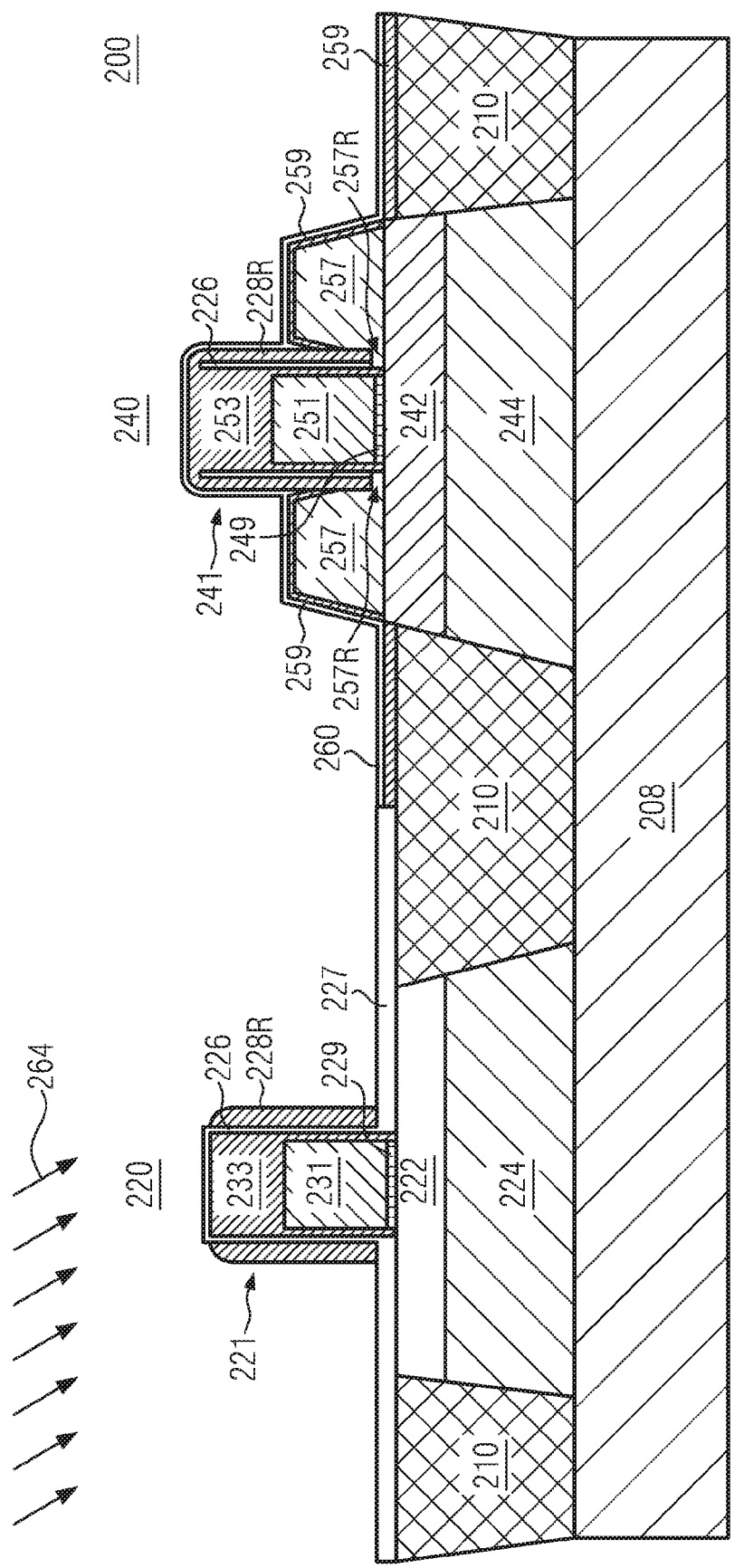

FIG. 11 illustrates yet a further processing step 264. The processing step 264 may be an etching process. The etching process 264 may utilize well-understood etching techniques for etching silicon nitride. The second cap layer 228 is removed from the oxide layer 226, 227 by the etching process 264. On the other hand, the P-channel region 240 is protected by the masking layer 260. The etching process 264 is stopped once the oxide layer 226 above the gate cap layer 233 is reached. Thus, at the top of the gate structure 221, i.e., on the gate cap layer 233, the oxide layer 226 is freed, again. Furthermore, on the sides of the gate structure 221 in a direction substantially perpendicular to the semiconductor layer 222, a remainder 228R of the second cap layer 228 is formed. The thickness of this remainder 228R may be controlled by the etching process 264.

Figure 12:
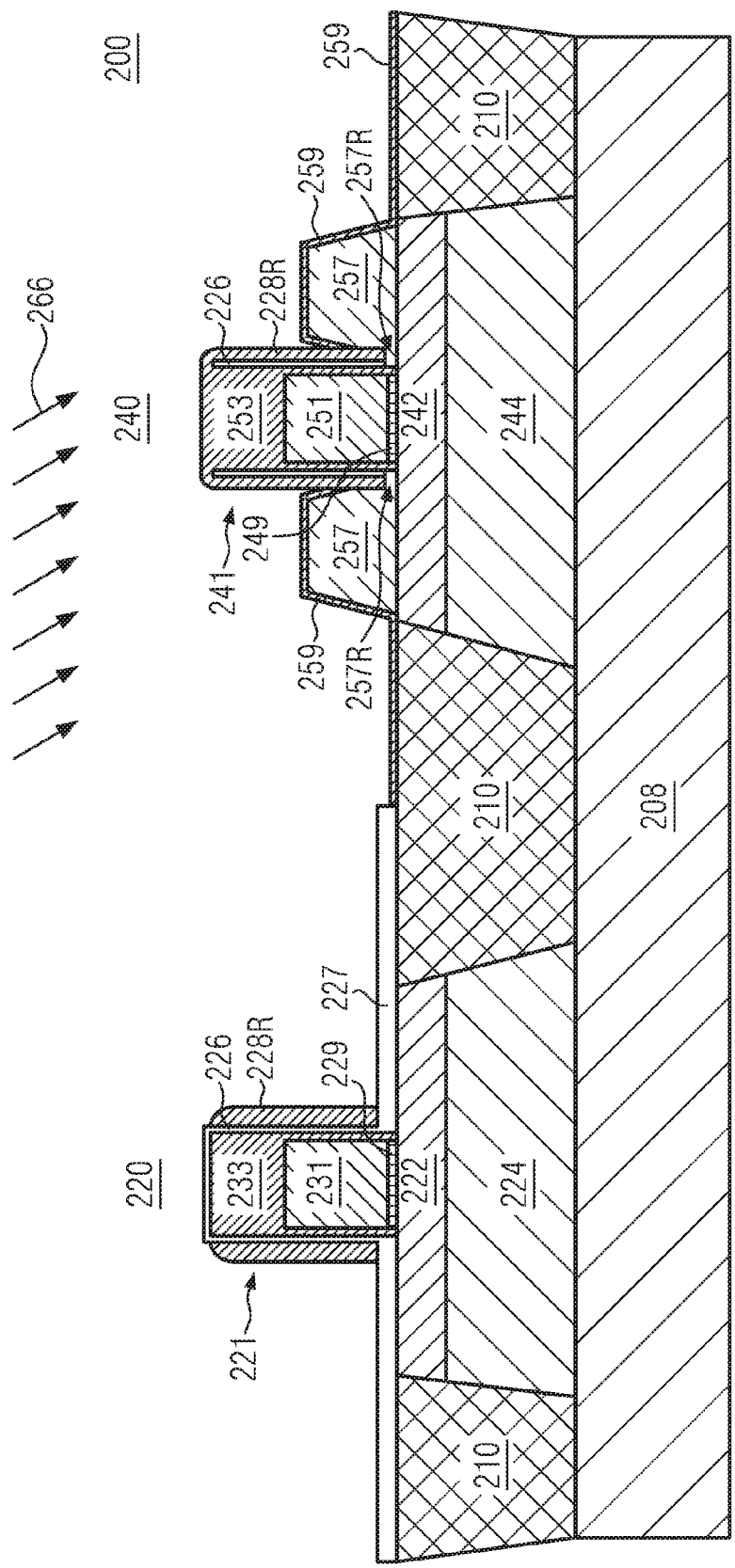

FIG. 12 illustrates a further processing step 266 so as to remove or strip the masking layer 260 on the P-channel region 240. The removal step may include well-understood techniques for mask removal. The mask removal step 266 as illustrated in FIG. 12 may serve as a preparatory step for a following etching step in the proximity of the gate structure 221 of the N-channel region 220.

Figure 13:
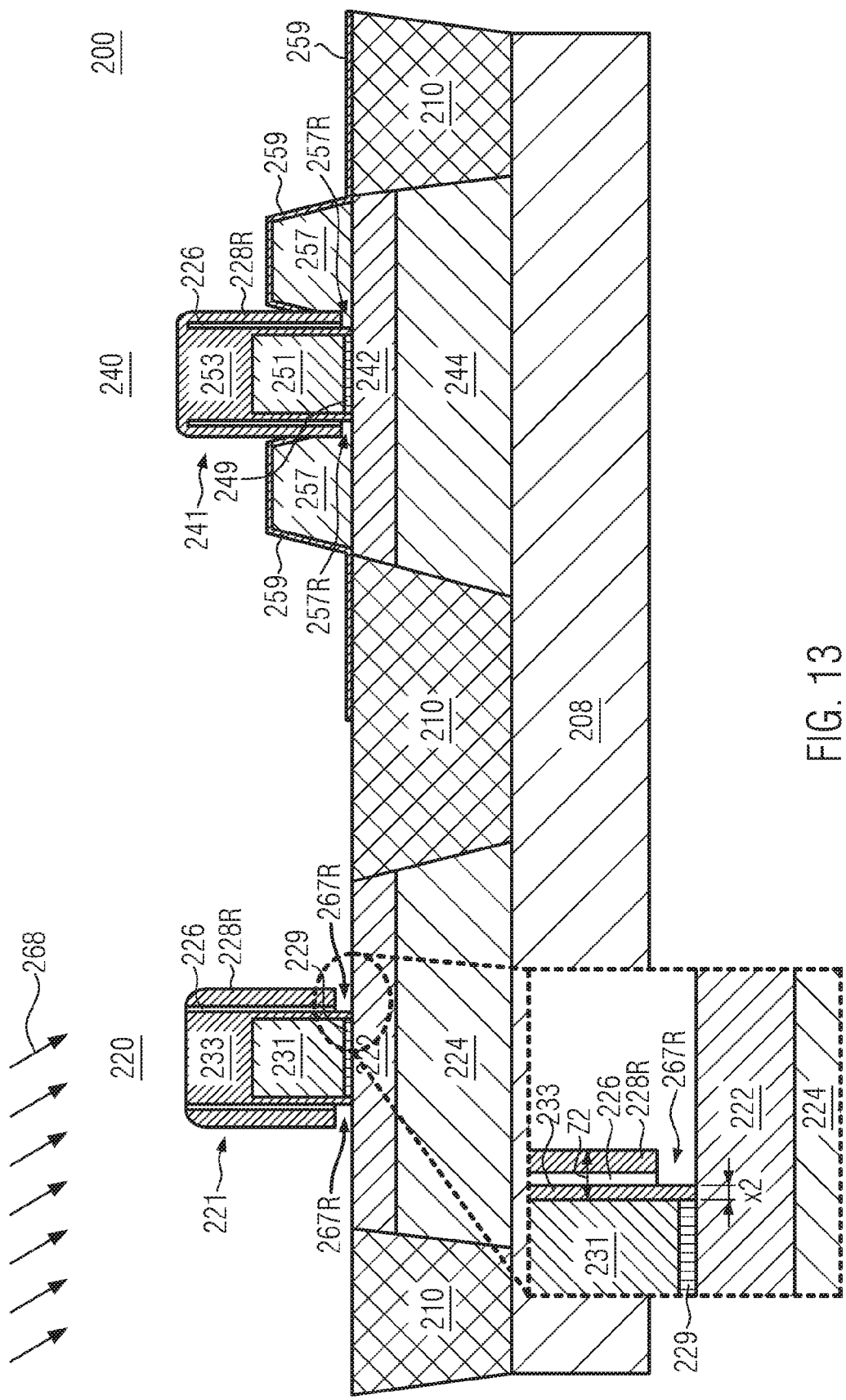

FIG. 13 illustrates a further processing step 268. Similar to FIG. 7, the processing step 268 serves to remove the part of the oxide liner 227 which was formed on the semiconductor layer 222 and on the shallow trench insulators 210. Processing step 268 may include an etching step using well-understood etching techniques. Thereby, the thicker part 227 of the oxide layer 226, 227 is removed from the semiconductor layer 222 in the N-channel region. Owing to the sequence of forming steps of FIGS. 9-12, the processing step 268 will under-etch the remainder of the second cap layer 228R and the first part of the oxide liner 226 in a direction substantially parallel to the semiconductor layer 222 so as to form a recess 267R on and above the semiconductor layer 222. In other words, the second cap layer 228R will be under-etched in proximity to the gate structure 221. This is also indicated in the enlargement figure of FIG. 13. Further, the first part of the oxide liner 226 will also be at least partially removed by the processing step 268. As indicated in FIG. 13, the gate electrode 231 as well as gate metal layer 229 remain covered by the first cap layer 233. The thickness x2 of the first cap layer 233 in a direction substantially perpendicular to the gate electrode 231 and on the semiconductor layer 222 may be controlled by the intensity of the processing step. The longer the processing step 268 is applied, the thinner x2 gets. Moreover, the combined thickness Z2 of the first cap layer 233, the oxide layer 226 and the second cap layer 228R in a direction substantially perpendicular to the gate electrode 231 and on the semiconductor layer 222 is independent from processing step 268. It should be noted that x2 and Z2 may be controlled independently.

Figure 14:
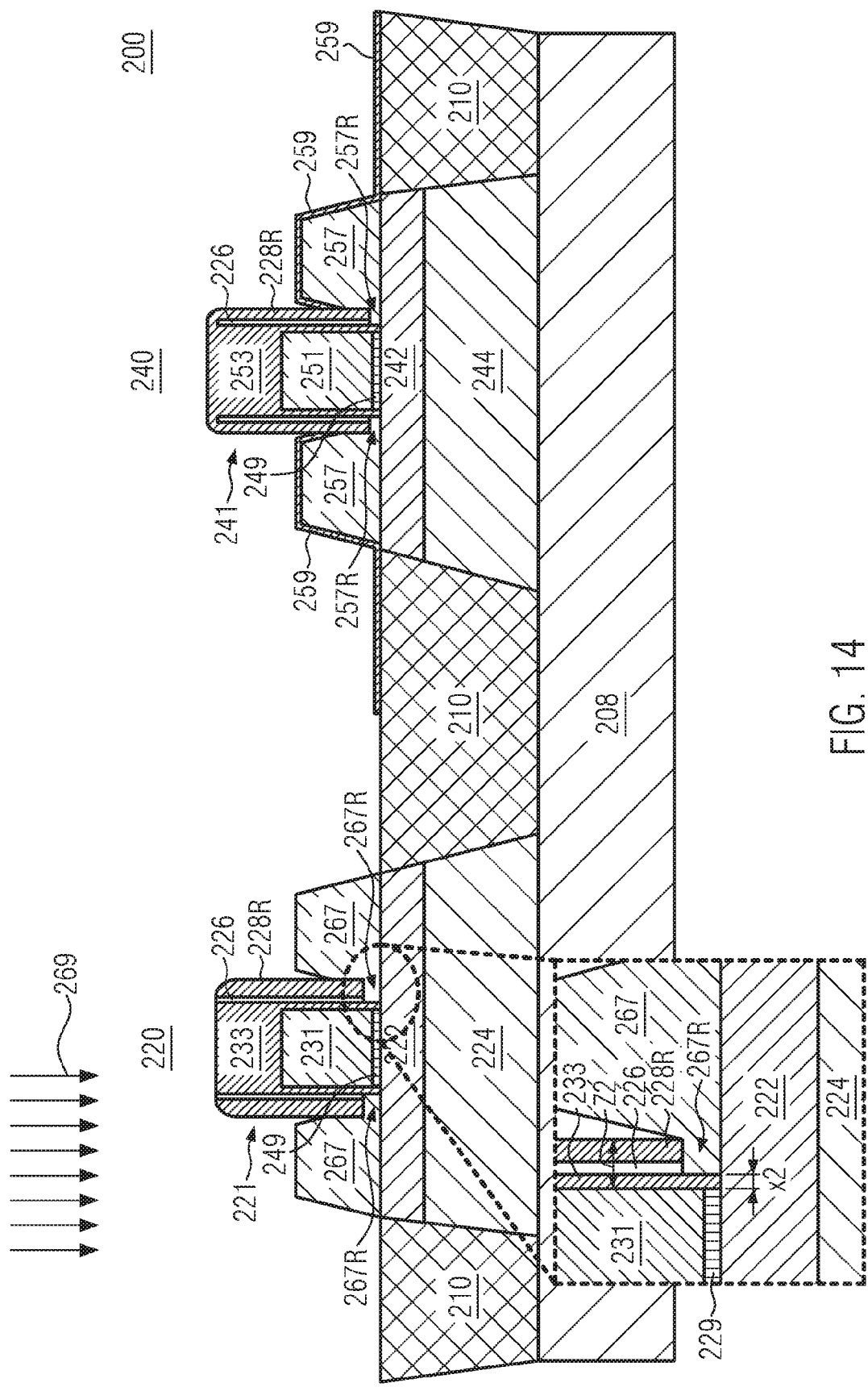

FIG. 14 illustrates a further processing step 269 for epitaxially growing raised source/drain regions 267 on the semiconductor layer 222 in the N-channel region 220. The raised source/drain regions 267 will raise in a direction substantially perpendicular to the semiconductor layer 222. The raised source/drain regions 267 will fill the recesses 267R on either side, i.e., in the proximity of the gate structure 231. Thereby, a small portion of the total raised source/drain regions 267 will be formed closer to the gate electrode 231. A larger part of the raised source/drain regions 267 will be formed further away from the gate electrode 231. Since all the thicknesses of the cap layers 233 and 228R, respectively, as well as the oxide layer 226, may be selected independently, the overall capacitances may be optimized.

These processing steps may be followed by standard processing steps for removal of the gate cap by well-understood dry etching techniques within standard flow schemes.

The particular embodiments disclosed above are illustrative only, as the claimed invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the claimed invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A semiconductor device, comprising:
   a semiconductor-on-insulator (SOI) substrate comprising
      a semiconductor bulk substrate, a buried insulation layer positioned above said semiconductor bulk substrate, and a semiconductor layer positioned above said buried insulation layer; and
   a transistor device positioned in and above said SOI substrate, said transistor device comprising:
      a gate structure positioned above said semiconductor layer, said gate structure comprising a gate electrode and a first cap layer covering upper and sidewall surfaces of said gate electrode;
      an oxide liner positioned adjacent to and covering sidewalls of said gate structure;
      a second cap layer positioned adjacent to and covering said oxide liner;
      a recess located adjacent to said gate structure, wherein said recess is at least partially defined by an upper surface of said semiconductor layer, a bottom surface of said second cap layer, and at least part of said oxide liner; and
      raised source/drain regions positioned above said upper surface of said semiconductor layer, wherein portions of said raised source/drain regions are positioned in said recess.

2. The semiconductor device of claim 1, wherein said transistor device is a P-channel field effect transistor, said raised source/drain regions comprise P-doped silicon, and said semiconductor layer comprises silicon-germanium material.

3. The semiconductor device of claim 1, wherein said transistor device is an N-channel field effect transistor, said raised source/drain regions comprise N-doped silicon, and said semiconductor layer is a crystalline silicon layer.

4. The semiconductor device of claim 1, wherein at least one of said first cap layer and said second cap layer comprise silicon nitride and wherein said oxide liner comprises undoped silicon oxide (UDOX).

5. The semiconductor device of claim 1, wherein said gate structure comprises a gate metal layer positioned above said semiconductor layer.

6. The semiconductor device of claim 1, wherein said gate structure further comprises at least one of a gate dielectric layer and a work function-adjusting material layer positioned between said gate electrode and said semiconductor layer.

7. The semiconductor device of claim 1, wherein said raised source/drain regions do not extend into said semiconductor layer.

8. A semiconductor device, comprising:
   a semiconductor-on-insulator (SOI) substrate comprising
      a semiconductor bulk substrate, a buried insulation layer positioned above said semiconductor bulk substrate, and a semiconductor layer positioned above said buried insulation layer; and
   a transistor device positioned in and above said SOI substrate, said transistor device comprising:
      a gate structure positioned above said semiconductor layer;

a cap layer positioned above said gate structure;

a sidewall spacer structure positioned adjacent to sidewalls of said gate structure and sidewalls of said cap layer, said sidewall spacer structure comprising a first spacer, an oxide liner positioned adjacent to and covering said first spacer, and a second spacer positioned adjacent to and covering said oxide liner;

a recess located adjacent to said gate structure, wherein said recess extends above and substantially parallel to an upper surface of said semiconductor layer and extends below a bottom surface of said second spacer and below at least a portion of said oxide liner; and raised source/drain regions positioned above upper surface of said semiconductor layer, wherein portions of said raised source/drain regions are positioned in said recess.

9. The semiconductor device of claim 8, wherein said transistor device is one of a P-channel field effect transistor and an N-channel field effect transistor.

10. The semiconductor device of claim 8, wherein cap layer comprises silicon nitride.

11. The semiconductor device of claim 10, wherein said first spacer and said second spacer comprise silicon nitride, and wherein said oxide liner comprises undoped silicon oxide (UDOX).

12. The semiconductor device of claim 8, wherein said gate structure further comprises at least one of a gate metal layer, a gate dielectric layer, and a work function-adjusting material layer positioned between said gate metal layer and said gate dielectric layer.

13. A semiconductor device, comprising:

a first transistor device positioned in and above a first active region of a semiconductor-on-insulator (SOI) substrate, said first transistor device comprising:

a first gate electrode positioned above an upper surface of a first semiconductor layer positioned in said first active region;

a first cap layer positioned above said first gate electrode;

a first sidewall spacer structure positioned adjacent to sidewalls of said first gate electrode and sidewalls of said first cap layer;

a first recess located adjacent to said first gate structure, wherein said first recess extends above and substantially parallel to said upper surface of said first semiconductor layer and below a bottom surface of at least a portion of said first sidewall spacer structure, wherein said first sidewall spacer structure comprises a first nitride spacer, an oxide liner positioned adjacent to and covering said first nitride spacer, and a second nitride spacer positioned adjacent to and covering said oxide liner, and wherein said first recess extends below a bottom surface of said second nitride spacer and below at least a portion of said oxide liner; and first raised source/drain regions positioned above said upper surface of said first semiconductor layer, wherein portions of said first raised source/drain regions are positioned in said first recess.

14. The semiconductor device of claim 13, wherein said first transistor device is a P-channel field effect transistor.

15. The semiconductor device of claim 14, wherein said first raised source/drain regions comprise P-doped silicon and said first semiconductor layer comprises silicon-germanium.

16. The semiconductor device of claim 13, further comprising:

a second transistor device positioned in and above a second active region of said SOI substrate, said second transistor device comprising:

a second gate electrode positioned above an upper surface of a second semiconductor layer in said second active region;

a second cap layer positioned above said second gate electrode;

a second sidewall spacer structure positioned adjacent to sidewalls of said second gate electrode and sidewalls of said second cap layer;

a second recess located adjacent to said second gate structure, wherein said second recess extends above and substantially parallel to said upper surface of said second semiconductor layer and below a bottom surface of at least a portion of said second sidewall spacer structure; and second raised source/drain regions positioned above said upper surface of said second semiconductor layer, wherein portions of said second raised source/drain regions are positioned in said second recess.

17. The semiconductor device of claim 16, wherein said second sidewall spacer structure comprises a first nitride spacer, an oxide liner positioned adjacent to and covering said first nitride spacer, and a second nitride spacer positioned adjacent to and covering said oxide liner, and wherein said second recess extends below a bottom surface of said second nitride spacer and below at least a portion of said oxide liner.

18. The semiconductor device of claim 16, wherein said second transistor device is an N-channel field effect transistor.

19. The semiconductor device of claim 18, wherein said second raised source/drain regions comprise N-doped silicon and said second semiconductor layer is a crystalline silicon layer.

* * * * *